US010008931B2

(12) United States Patent
Ideno et al.

(10) Patent No.: US 10,008,931 B2
(45) Date of Patent: Jun. 26, 2018

(54) SEMICONDUCTOR INTEGRATED CIRCUIT

(71) Applicant: TOSHIBA MEMORY CORPORATION, Minato-ku (JP)

(72) Inventors: Hiroyuki Ideno, Yokohama (JP); Hidefumi Kushibe, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/257,131

(22) Filed: Sep. 6, 2016

(65) Prior Publication Data

US 2017/0264196 A1    Sep. 14, 2017

Related U.S. Application Data

(60) Provisional application No. 62/306,948, filed on Mar. 11, 2016.

(51) Int. Cl.
| | |
|---|---|
| *G05F 1/575* | (2006.01) |
| *G05F 1/56* | (2006.01) |
| *G05F 1/46* | (2006.01) |
| *G05F 1/565* | (2006.01) |
| *G05F 1/618* | (2006.01) |
| *H02M 3/158* | (2006.01) |

(52) U.S. Cl.
CPC .................. *H02M 3/158* (2013.01)

(58) Field of Classification Search
CPC . G05F 1/575; G05F 1/467; G05F 1/56; G05F 1/565; G05F 1/618
See application file for complete search history.

(56) References Cited

U.S. PATENT DOCUMENTS

| 7,675,273 B2* | 3/2010 | Ko .......................... G05F 1/575 |
| | | 323/269 |
| 8,781,537 B2 | 7/2014 | Watanabe et al. |
| 2010/0144402 A1* | 6/2010 | Watanabe .......... G06K 19/0723 |
| | | 455/572 |

(Continued)

FOREIGN PATENT DOCUMENTS

| JP | 2005-202781 | 7/2005 |
| JP | 2006-53829 | 2/2006 |

(Continued)

*Primary Examiner* — Timothy J Dole
*Assistant Examiner* — Sisay G Tiku
(74) *Attorney, Agent, or Firm* — Oblon, McClelland, Maier & Neustadt, L.L.P.

(57) ABSTRACT

According to one embodiment, in a semiconductor integrated circuit, a first input terminal of an error amplifier is electrically connected to a third node between a second node and a reference potential. A second input terminal of the error amplifier is electrically connected to a reference voltage. An output terminal of the error amplifier is electrically connected to a gate of an output transistor. A first input terminal of a comparator is electrically connected to a fourth node between the second node and the reference potential. A second input terminal of the comparator is electrically connected to the reference voltage. One end of a coupling capacitance is electrically connected to an output terminal of the comparator. A gate of an auxiliary transistor is electrically connected to the other end of the coupling capacitance. A drain of the auxiliary transistor is electrically connected to the second node.

20 Claims, 6 Drawing Sheets

(56) References Cited

U.S. PATENT DOCUMENTS

| | | | |
|---|---|---|---|
| 2013/0099764 A1* | 4/2013 | Zhang | G05F 1/575 |
| | | | 323/273 |
| 2014/0084878 A1* | 3/2014 | Tomioka | H03K 17/005 |
| | | | 323/225 |
| 2014/0266104 A1* | 9/2014 | El-Nozahi | G05F 1/575 |
| | | | 323/280 |
| 2014/0266118 A1* | 9/2014 | Chern | H02M 3/156 |
| | | | 323/283 |
| 2015/0229304 A1 | 8/2015 | Suzuki | |
| 2016/0147239 A1* | 5/2016 | Yan | G05F 1/575 |
| | | | 323/280 |
| 2016/0266599 A1* | 9/2016 | Ideno | G05F 3/267 |
| 2017/0115679 A1* | 4/2017 | Watanabe | G05F 1/575 |

FOREIGN PATENT DOCUMENTS

| | | |
|---|---|---|
| JP | 5215154 | 6/2013 |
| JP | 2015-153074 | 8/2015 |

\* cited by examiner

SEMICONDUCTOR INTEGRATED CIRCUIT

CROSS-REFERENCE TO RELATED APPLICATIONS

This application is based upon and claims the benefit of priority from U.S. Provisional Application No. 62/306,948, filed on Mar. 11, 2016; the entire contents of which are incorporated herein by reference.

FIELD

Embodiments described herein relate generally to a semiconductor integrated circuit.

BACKGROUND

In a semiconductor integrated circuit, a load circuit is connected to an output of a regulator circuit which generates a certain voltage. At this time, it is desired to stabilize an output voltage from the regulator circuit to the load circuit.

DETAILED DESCRIPTION

In general, according to one embodiment, there is provided a semiconductor integrated circuit including an output transistor, an error amplifier, a comparator, a coupling capacitance, and an auxiliary transistor. The output transistor is electrically connected between a first node on a side near a power source and a second node on a side near an output. A first input terminal of the error amplifier is electrically connected to a third node between the second node and a reference potential. A second input terminal of the error amplifier is electrically connected to a reference voltage. An output terminal of the error amplifier is electrically connected to a gate of the output transistor. A first input terminal of the comparator is electrically connected to a fourth node between the second node and the reference potential. A second input terminal of the comparator is electrically connected to the reference voltage. One end of the coupling capacitance is electrically connected to an output terminal of the comparator. A gate of the auxiliary transistor is electrically connected to the other end of the coupling capacitance. A drain of the auxiliary transistor is electrically connected to the second node.

Exemplary embodiments of a semiconductor integrated circuit will be explained below in detail with reference to the accompanying drawings. The present invention is not limited to the following embodiments.

First Embodiment

Figure 1:
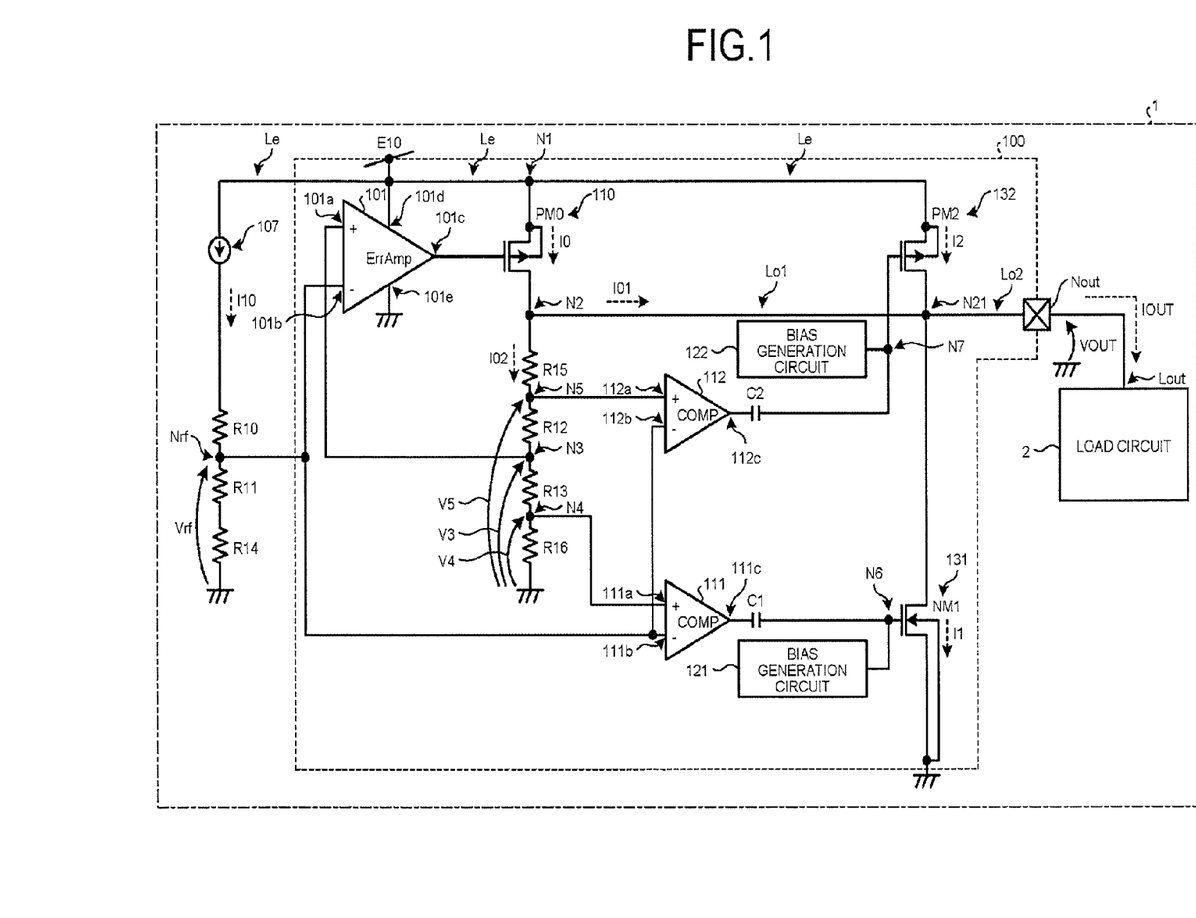
FIG. 1 is a circuit diagram illustrating a configuration of a semiconductor integrated circuit according to a first embodiment.

A semiconductor integrated circuit 1 according to a first embodiment will be described using FIG. 1. FIG. 1 is a circuit diagram illustrating a configuration of the semiconductor integrated circuit 1.

The semiconductor integrated circuit 1 is mounted with a regulator circuit 100. The regulator circuit 100 is provided between a power node E10 and an output node Nout in the semiconductor integrated circuit 1. At the power node E10, a power source voltage can be supplied from the outside (for example, a host controller) through a power source terminal (not illustrated) of the semiconductor integrated circuit 1.

In the semiconductor integrated circuit 1, the output node Nout of the regulator circuit 100 is connected to a load circuit 2 through an output line Lout. A voltage VOUT of the output line Lout can be referred to as the voltage VOUT at the output node Nout. The load circuit 2 is, for example, a logic circuit, and can operate in synchronization with a clock signal supplied from a clock generation circuit (not illustrated).

When the power source voltage is supplied to the power node E10, the regulator circuit 100 generates the inner power source voltage (the voltage VOUT) from the supplied power source voltage, and supplies the generated inner power source voltage to the load circuit 2.

The semiconductor integrated circuit 1 includes the regulator circuit 100, a constant current source 107, and resistive elements R10, R11, and R14. The regulator circuit 100 includes an output transistor 110, an error amplifier 101, and resistive elements R12, R13, R15, and R16.

The output transistor 110 is electrically connected between a node N1 and a node N2. The node N1 is a node on a side near the power node E10, and is connected to the power node E10 through a power line Le. The node N2 is a node on a side near the output node Nout, and is electrically connected to the output node Nout through output lines Lo1 and Lo2. At a normal time, the output transistor 110 is remained in a half-on state, and operates equivalently as a variable resistive element.

The output transistor 110 includes a PMOS transistor PM0. The PMOS transistor PM0 is configured such that the source is electrically connected to the node N1, the drain is electrically connected to the node N2 and the gate is electrically connected to an output terminal 101c of the error amplifier 101.

The error amplifier 101 includes a non-inverting input terminal 101a, an inverting input terminal 101b, the output terminal 101c, a bias terminal 101d, and a reference potential terminal 101e. The non-inverting input terminal 101a is electrically connected to a node N3. The node N3 is a node between the node N2 and the reference potential (for example, the ground potential). The node N3 is electrically connected to the node N2 through the resistive elements R12 and R15, and electrically connected to the reference potential through the resistive elements R13 and R16. A current I01 of the majority of a drain current I0 of the PMOS transistor PM0 flows out to the output line Lout, and a current I02 (<<I01) of a part of the drain current I0 of the PMOS transistor PM0 flows to the resistive elements R15, R12, R13, and R16. The voltage at the node N2 is divided by the resistive elements R15 and R12 and the resistive elements R13 and R16, and thus a voltage V3 at the node N3 is generated. A voltage V5 at a node N5 between the resistive element R15 and the resistive element R12 is larger than the voltage V3 at the node N3 (V5>V3). A voltage V4 at a node N4 between the resistive element R13 and the resistive element R16 is smaller than the voltage V3 at the node N3 (V4<V3).

The inverting input terminal 101b is electrically connected to a reference node Nrf. The reference node Nrf is a node between the power line Le and the reference potential (for example, the ground potential). The reference node Nrf is connected to the power line Le through the resistive element R10 and the constant current source 107, and connected to the reference potential through the resistive elements R11 and R14. The constant current source 107 causes a current I10 to flow to the resistive elements R10, R11, and R14. At this time, a reference voltage Vrf at the reference node Nrf is generated by the resistive elements R11 and R14 and the current I10.

The output terminal 101c is connected to the gate of the PMOS transistor PM0. The bias terminal 101d is connected to the power node E10. The reference potential terminal 101e is connected to the reference potential (for example, the ground potential).

The error amplifier 101 controls a voltage of the output terminal 101c such that a difference between the voltage V3 at the node N3 and the reference voltage Vrf becomes substantially "0". In other words, the error amplifier 101 performs feedback control of a gate voltage of the PMOS transistor PM0 such that the voltage V3 at the node N3 approaches the reference voltage Vrf (first feedback control). A loop containing the error amplifier 101→the PMOS transistor PM0→the node N2→the resistive element R15→the node N5→the resistive element R12→the node N3→the error amplifier 101 forms a first feedback loop for performing the first feedback control.

In the semiconductor integrated circuit 1, it is difficult to connect a capacitive element to the output node Nout while satisfying restrictions on layout and an expectation of cost. Therefore, in a case where a current (an output current) IOUT of the output line Lout caused by the operation of the load circuit 2 varies at a high speed, a voltage (an output voltage) VOUT of the output line Lout varies in a variation range exceeding an allowable range. Therefore, the load circuit 2 may cause an erroneous operation.

Figure 2:
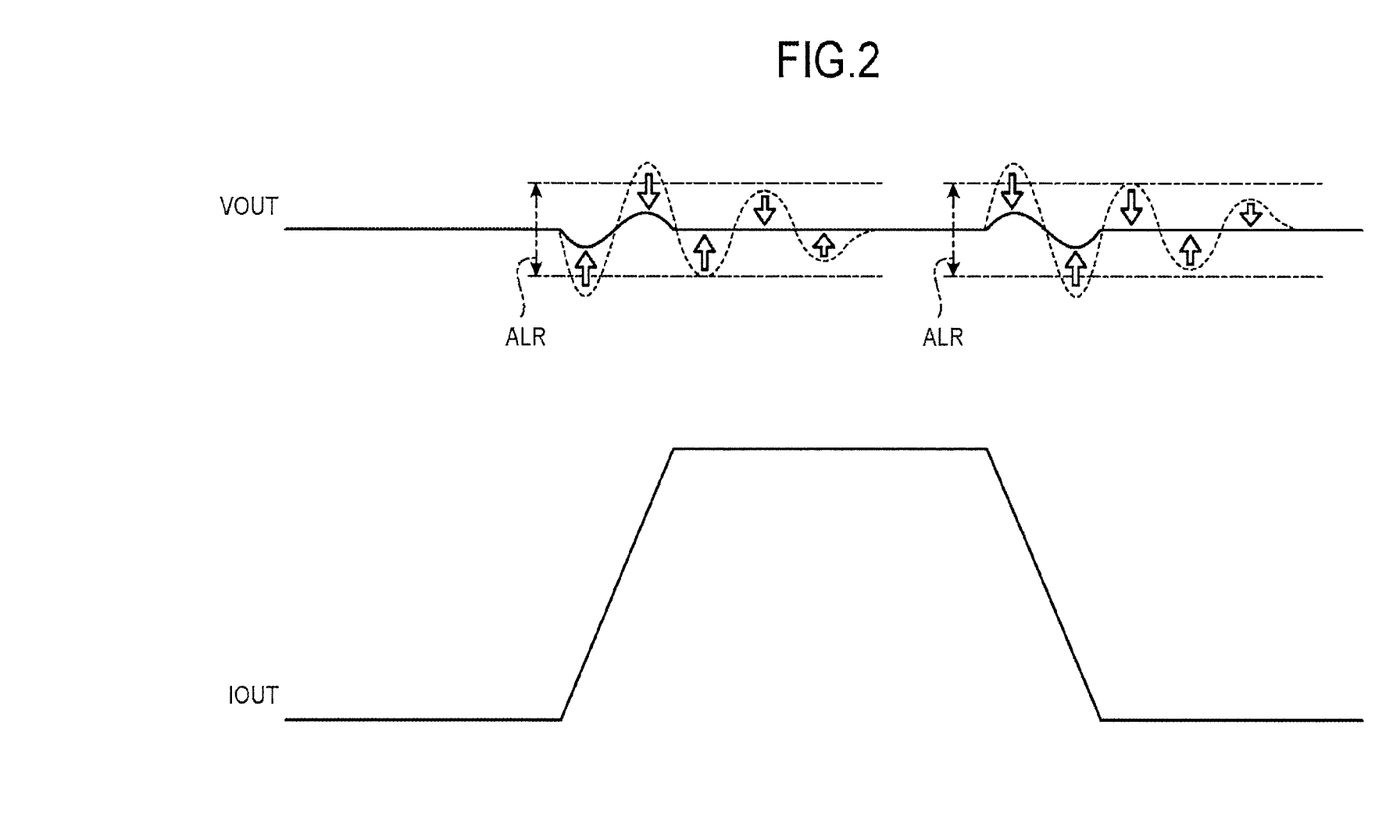
FIG. 2 is a waveform diagram illustrating an operation of the semiconductor integrated circuit according to the first embodiment.

For example, in a case where there occurs an undershooting variation in the output voltage VOUT, and the undershooting variation is later than a response speed of the error amplifier 101, the variation range can be made to fall within the allowable range by the first feedback control. However, in a case the load circuit 2 is a logic circuit capable of operating in synchronization with a high speed clock, for example, when the clock frequency for the operation of the load circuit 2 is switched from a low speed to a high speed or from a high speed to a low speed as illustrated in FIG. 2, the output current Iout may vary at a high speed. FIG. 2 is a waveform diagram illustrating an operation of the semiconductor integrated circuit 1.

At this time, as depicted by the broken line in FIG. 2, in a case where the undershooting fluctuation faster than the response speed of the error amplifier 101 occurs in the output voltage VOUT, the control (the first feedback control) of the gate voltage of the output transistor PM0 cannot follow the fluctuation, and the output voltage VOUT may change in a fluctuation range exceeding the allowable range ALR. In addition, in a case where an overshooting fluctuation occurs in the output voltage VOUT, the error amplifier 101 controls the gate voltage in a direction to turn off the output transistor PM0, but as depicted by the broken line in FIG. 2, a time tends to be taken until the output voltage VOUT is converged on a setting voltage depending on the state of the load circuit 2.

With this regard, it is considered that the response speed of the first feedback control is increased by increasing the responsiveness of the error amplifier 101. In this case, since there is a need to significantly increase a current flowing in the transistors in the error amplifier 101, there is a possibility to significantly increase the power consumption of the regulator circuit 100.

Therefore, in the first embodiment, the regulator circuit 100 is added with a feedback loop which is DC-cut and responses at a high speed besides the first feedback loop for the purpose of suppressing the fluctuation of the output voltage VOUT while achieving low power consumption.

Specifically, the regulator circuit 100 includes comparators 111 and 112, coupling capacitive elements C1 and C2, auxiliary transistors 131 and 132, and bias generation circuits 121 and 122.

The comparator 111 includes a non-inverting input terminal 111a, an inverting input terminal 111b, and an output terminal 111c. The non-inverting input terminal 111a is electrically connected to the node N4. At a normal time, the voltage V4 at the node N4 is smaller than the voltage V3 at the node N3 (V4<V3). The inverting input terminal 111b is electrically connected to the reference node Nrf. The reference node Nrf has the reference voltage Vrf. The output terminal 111c is electrically connected to one end of the coupling capacitive element C1.

One end of the coupling capacitive element C1 is electrically connected to the output terminal 111c of the comparator 111, and the other end is connected to the gate of the auxiliary transistor 131 through a node N6. The node N6 is a node between the other end of the coupling capacitive element C1 and the gate of the auxiliary transistor 131.

The auxiliary transistor 131 is electrically connected between a node N21 and the reference potential (for example, the ground potential). The node N21 is a node on a side near the output node Nout electrically connected to the node N2 through the output line Lo1, and electrically connected to the output node Nout through the output line Lo2.

The auxiliary transistor 131 includes an NMOS transistor NM1. The source of the NMOS transistor NM1 is electrically connected to the reference potential, the drain is electrically connected to the node N21, and the gate is electrically connected to the node N6.

The bias generation circuit 121 is electrically connected to the node N6. The bias generation circuit 121 generates a bias voltage at a normal time such that the auxiliary transistor 131 is operated in a weak inversion region, and supplies the bias voltage to the gate of the auxiliary transistor 131 (the NMOS transistor NM1) through the node N6. Therefore, at a normal time, the auxiliary transistor 131 is maintained in the half-on state, and equivalently operated as a variable resistive element. The bias generation circuit 121 adjusts the bias voltage such that an equivalent resistance value of the auxiliary transistor 131 at a normal time becomes significantly large compared to an equivalent resistance value of the output transistor 110. In other words, a current I1 flowing in the auxiliary transistor 131 is set to significantly small compared to the current I01 flowing from the output transistor 110 to the node N21.

A loop containing the comparator 111→the coupling capacitive element C1→the node N6→the auxiliary transistor 131→the node N21→the node N2→the resistive element R15→the node N5→the resistive element R12→the node N3→the resistive element R13→the node N4→the comparator 111 forms a second feedback loop for second feedback control. The second feedback loop is a loop disconnected with respect to the DC component by the coupling capacitive element C1 and, in other words, a DC-cut loop. Therefore, the second feedback control can be selectively performed in a case where the output current IOUT varies at a high speed.

The comparator 111 compares the voltage V4 received by the non-inverting input terminal 111a and the reference voltage Vrf received by the inverting input terminal 111b, and outputs the comparison result from the output terminal 111c. For example, in a case where the voltage V4 is larger than the reference voltage Vrf, the comparator 111 outputs an H level. In a case where the voltage V4 is smaller than the reference voltage Vrf, the comparator 111 outputs an L level.

In a case where the voltage V3≈reference voltage Vrf is satisfied, the voltage V4 (<V3) becomes smaller than the reference voltage Vrf and this state is maintained by the first feedback control, so that the comparator 111 stably outputs the L level. At this time, since the output terminal 111c and the node N6 of the comparator 111 are disconnected with respect to the DC components by the coupling capacitive element C1, the voltage at the node N6 becomes substantially equal to the bias voltage from the bias generation circuit 121, and the resistance value of the auxiliary transistor 131 becomes significantly large compared to the resistance value of the output transistor 110.

On the other hand, in a case where the overshooting variation occurs in the output voltage VOUT due to the very speedy variation of the output current IOUT, the comparator 111 can detects the overshooting variation. When the voltage V4 becomes larger than the reference voltage Vrf as the voltage at the node N2 is increased, the output of the comparator 111 is changed from the L level to the H level. When the AC component varying from the L level to the H level is transferred to the node N6 through the coupling capacitive element C1, the voltage at the node N6 is temporally increased from the bias voltage. Therefore, since the auxiliary transistor 131 temporally transitions from the half-on state to an ON state and the potential at the node N21 is brought down toward the reference potential (the ground potential), the voltage VOUT at the output node Nout is pulled down through the node N21 by the auxiliary transistor 131 as depicted by a white downward arrow in FIG. 2.

In other words, the second feedback control is not always performed at a normal time, but selectively performed in a case where the overshooting variation occurs in the output voltage VOUT, in which the output voltage VOUT is pulled down toward the reference potential (the ground potential). In addition, since the change from the L level to the H level of the output of the comparator 111 is performed at a high speed compared to the responsiveness of the error amplifier 101, the response in the second feedback control can be made at a high speed compared to the first feedback control. In other words, the second feedback loop is a loop which is selectively operated in a case where the overshooting variation occurs in the output voltage VOUT, in which the response can be made at a high speed compared to the first feedback loop.

In addition, the comparator 112 includes a non-inverting input terminal 112a, an inverting input terminal 112b, and an output terminal 112c. The non-inverting input terminal 112a is electrically connected to the node N5. At a normal time, the voltage V5 at the node N5 is larger than the voltage V3 at the node N3 (V5>V3). The inverting input terminal 112b is electrically connected to the reference node Nrf. The reference node Nrf includes the reference voltage Vrf. The output terminal 112c is electrically connected to one end of the coupling capacitive element C2.

One end of the coupling capacitive element C2 is electrically connected to the output terminal 112c of the comparator 112, and the other end is connected to the gate of the auxiliary transistor 132 through a node N7. The node N7 is a node between the other end of the coupling capacitive element C2 and the gate of the auxiliary transistor 132.

The auxiliary transistor 132 is electrically connected between the node N21 and the node N1. The node N21 is a node on a side near the output node Nout electrically connected to the node N2 through the output line Lo1, and electrically connected to the output node Nout through the output line Lo2.

The auxiliary transistor 132 includes a PMOS transistor PM2. The source of the PMOS transistor PM2 is electrically connected to the node N1, the drain is electrically connected to the node N21, and the gate is electrically connected to the node N7.

The bias generation circuit 122 is electrically connected to the node N7. The bias generation circuit 122 generates a bias voltage at a normal time so that the auxiliary transistor 132 is operated in a weak inversion region, and supplies the bias voltage to the gate of the auxiliary transistor 132 (the PMOS transistor PM2) through the node N7. Therefore, at a normal time, the auxiliary transistor 132 is maintained in the half-on state, and equivalently operated as a variable resistive element. The bias generation circuit 122 adjusts the bias voltage such that an equivalent resistance value of the auxiliary transistor 132 at a normal time becomes significantly large compared to an equivalent resistance value of the output transistor 110. In other words, a current I2 flowing in the auxiliary transistor 132 is set to significantly small compared to the current I01 flowing from the output transistor 110 to the node N21.

A loop containing the comparator 112→the coupling capacitive element C2→the node N7→the auxiliary transistor 132→the node N21→the node N2→the resistive element R15→the node N5→the comparator 112 forms a third feedback loop for third feedback control. The third feedback loop is disconnected with respect to the DC component by the coupling capacitive element C2 (that is, the DC-cut loop). Therefore, the third feedback control can be selectively performed in a case where the output current IOUT varies at a high speed.

The comparator 112 compares the voltage V5 received by the non-inverting input terminal 112a and the reference voltage Vrf received by the inverting input terminal 112b, and outputs the comparison result from the output terminal 112c. For example, in a case where the voltage V5 is larger than the reference voltage Vrf, the comparator 112 outputs the H level. In a case where the voltage V5 is smaller than the reference voltage Vrf, the comparator 112 outputs the L level.

In a case where the voltage V3≈reference voltage Vrf is satisfied by the first feedback control, the voltage V5 (>V3) becomes larger than the reference voltage Vrf and this state is maintained, so that the comparator 112 stably outputs the H level. At this time, since the output terminal 112c and the node N7 of the comparator 112 are disconnected with respect to the DC components by the coupling capacitive element C2, the voltage at the node N7 becomes substantially equal to the bias voltage from the bias generation circuit 122, and the resistance value of the auxiliary transistor 132 becomes significantly large compared to the resistance value of the output transistor 110.

On the other hand, in a case where the undershooting variation occurs in the output voltage VOUT due to the very speedy variation of the output current IOUT, the comparator 112 can detects the undershooting variation. When the voltage V5 becomes smaller than the reference voltage Vrf as the voltage at the node N2 is decreased, the output of the comparator 112 is changed from the H level to the L level. When the AC component varying from the H level to the L level is transferred to the node N7 through the coupling capacitive element C2, the voltage at the node N7 is temporally decreased from the bias voltage. Therefore, since the auxiliary transistor 132 transitions from the half-on state to an ON state and the potential at the node N21 is brought up toward the power source potential, the voltage VOUT at the output node Nout is pulled up through the node N21 by the auxiliary transistor 132 as depicted by a white upward arrow in FIG. 2.

In other words, the third feedback control is not always performed at a normal time, but selectively performed in a case where the undershooting variation occurs in the output voltage VOUT, in which the output voltage VOUT is pulled up toward the power source potential. In addition, since the change from the H level to the L level of the output of the comparator 112 is performed at a high speed compared to the responsiveness of the error amplifier 101, the response in the third feedback control can be made at a high speed compared to the first feedback control. In other words, the third feedback loop is a loop which is selectively operated in a case where the undershooting variation occurs in the output voltage VOUT, in which the response can be made at a high speed compared to the first feedback loop.

As described above, in the first embodiment, the high-speed response feedback loop (the second feedback loop and the third feedback loop) from which the DC component is cut is provided in the regulator circuit 100 besides the original feedback loop (the first feedback loop). With this configuration, the regulator circuit can respond to the very speedy variation of the output voltage VOUT which has not been followed in the first feedback loop. Further, it is possible to suppress the variation amount of the output voltage VOUT of the regulator circuit 100, without increasing the responsiveness of the error amplifier 101 which causes an increase of current consumption. In addition, since the high-speed response feedback loop can be selectively operated in a case where the output current IOUT varies at a high speed, it is possible to easily suppress the increase of the current consumption. In other words, in a case where the semiconductor integrated circuit 1 is difficult to connect the capacitive element for suppressing the voltage variation to the output node Nout of the regulator circuit 100, the variation of the output voltage VOUT of the regulator circuit 100 can be suppressed within the allowable range while achieving low power consumption of the regulator circuit 100.

Second Embodiment

Figure 3:
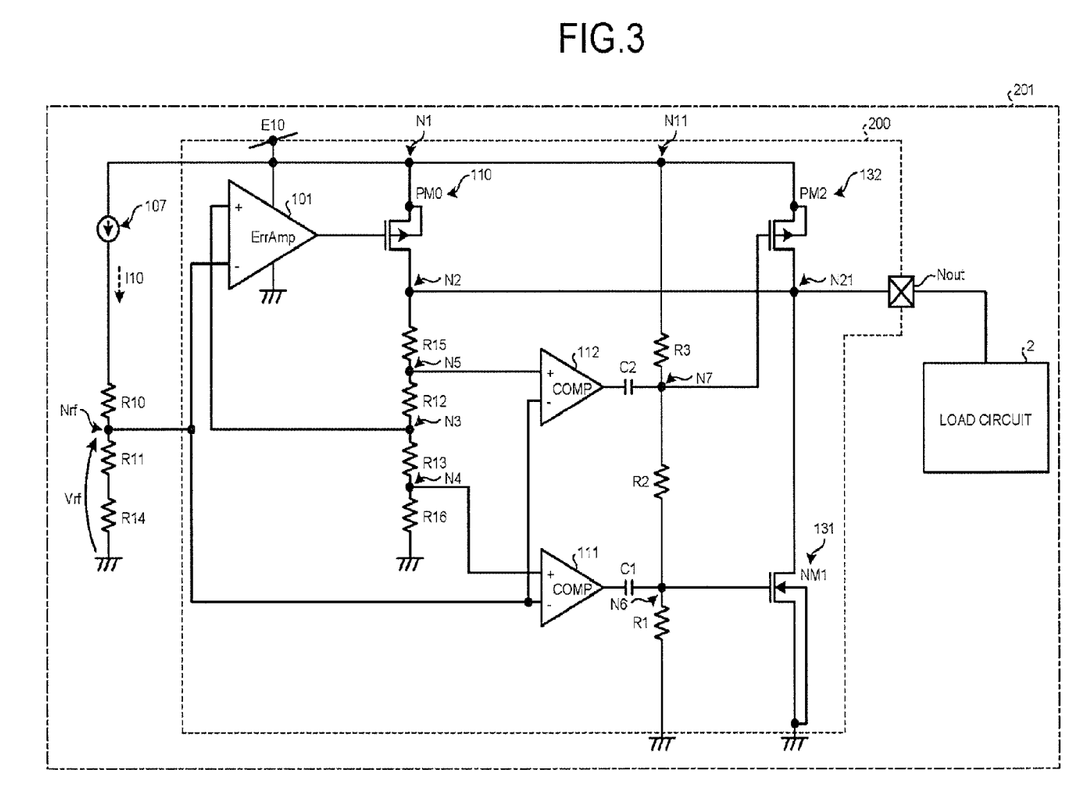
FIG. 3 is a circuit diagram illustrating a configuration of a semiconductor integrated circuit according to a second embodiment.

Next, a semiconductor integrated circuit 201 according to a second embodiment will be described. In the following, the description will be focused on the portions different from the first embodiment.

In the first embodiment, the bias voltage to be supplied to the auxiliary transistors 131 and 132 is generated by the bias generation circuits 121 and 122, but in the second embodiment, the bias voltage is generated through a resistive voltage division of the power source voltage.

Specifically, the semiconductor integrated circuit 201 includes a regulator circuit 200 in place of the regulator circuit 100 (see FIG. 1) as illustrated in FIG. 3. The regulator circuit 200 includes resistive elements R1, R2, and R3 in place of the bias generation circuits 121 and 122 (see FIG. 1).

The one end of the resistive element R1 is electrically connected to the node N6, and the other end is electrically connected to the reference potential (for example, the ground potential). The one end of the resistive element R2 is electrically connected to the node N6, and the other end is electrically connected to the node N7. The one end of the resistive element R3 is electrically connected to the node N7, and the other end is electrically connected to the power node E10 through a node N11 and the node N1. Setting the power source voltage to Vdd, resistance values R1, R2, and R3 of the respective resistive elements R1, R2, and R3 are determined such that Vdd×R1/(R1+R2+R3) becomes a bias voltage to make the auxiliary transistor 131 operate within the weak inversion region, and Vdd×(R1+R2)/(R1+R2+R3) becomes a bias voltage to make the auxiliary transistor 132 operate within the weak inversion region.

In addition, in a case where the overshooting variation occurs in the output voltage VOUT due to the very speedy variation of the output current IOUT and the voltage at the node N6 is temporally increased from the bias voltage, an increased transient voltage can be temporally stabilized by the current flowing from the node N6 to the resistive element R1. Similarly, in a case where the undershooting variation occurs in the output voltage VOUT due to the very speedy variation of the output current IOUT and the voltage at the node N7 is temporally decreased from the bias voltage, the decreased transient voltage can be temporally stabilized by the current flowing from the node N7 to the resistive element R2 and the resistive element R1.

As described above, in the second embodiment, the regulator circuit 200 of the semiconductor integrated circuit 201 can generate the bias voltage or the transient voltage by a simple configuration using the resistive elements R1, R2, and R3, and supply the bias voltage or the transient voltage to the auxiliary transistors 131 and 132.

Third Embodiment

Figure 4:
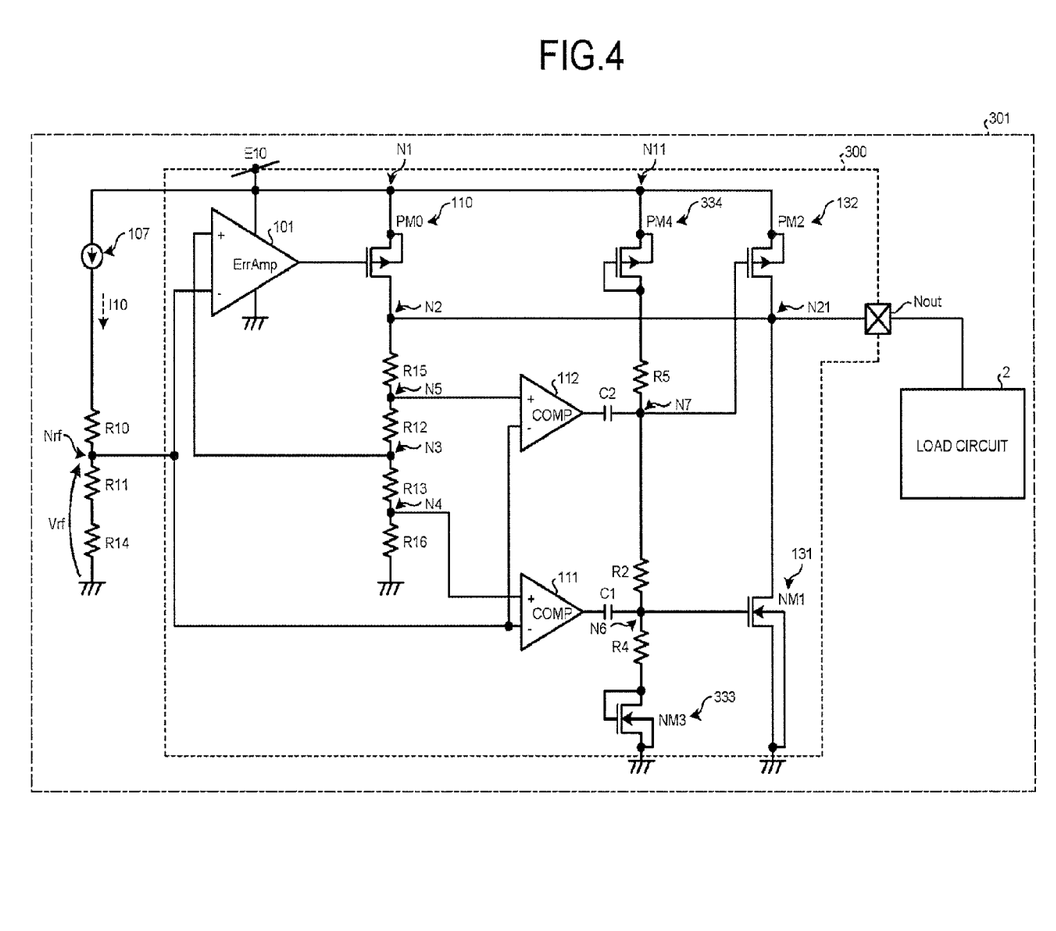
FIG. 4 is a circuit diagram illustrating a configuration of a semiconductor integrated circuit according to a third embodiment.

Next, a semiconductor integrated circuit 301 according to a third embodiment will be described. In the following, the description will be focused on the portions different from the second embodiment.

In the second embodiment, the bias voltage is generated through the resistive voltage division of the power source voltage using the resistive elements R1, R2, and R3. However, when the resistance values of the respective resistive elements R1, R2, and R3 vary, the transient voltage to be supplied to the auxiliary transistors 131 and 132 may be deviated from an appropriate value at the time of the very speedy variation of the output voltage VOUT. In the third embodiment, a configuration is considered in which the transient voltage to be supplied to the auxiliary transistors 131 and 132 becomes an appropriate value (turning-on value) at the time of the very speedy fluctuation of the output voltage VOUT even when the resistance values of the respective resistive elements R1, R2, and R3 vary.

Specifically, the semiconductor integrated circuit 301 includes a regulator circuit 300 in place of the regulator circuit 200 (see FIG. 3) as illustrated in FIG. 4. The regulator circuit 300 includes an auxiliary transistor 333, a resistive element R4, an auxiliary transistor 334, and a resistive element R5 in place of the resistive elements R1 and R3 (see FIG. 3).

The auxiliary transistor 333 is electrically connected between the resistive element R4 and the reference potential (for example, the ground potential). The auxiliary transistor 333 includes an NMOS transistor NM3. The source of the NMOS transistor NM3 is electrically connected to the reference potential, the drain is electrically connected to one end of the resistive element R4, and the gate is electrically connected to the drain. The dimension (=W/L; here, W: gate width, and L: gate length) of the NMOS transistor NM3 can be made equal to that of the NMOS transistor NM1.

The one end of the resistive element R4 is electrically connected to the drain of the auxiliary transistor 333, and the other end is electrically connected to the node N6. Setting an ON resistance value of the auxiliary transistor 333 to Ron3, a resistance value R4 of the resistive element R4 is determined as R4+Ron3≈R1 (see FIG. 3).

In a case where the overshooting variation occurs in the output voltage VOUT due to the very speedy variation of the output current IOUT and the voltage at the node N6 is temporally increased from the bias voltage, the current flows from the node N6 to the resistive element R4 and the auxiliary transistor 333 in a state where the auxiliary transistor 333 is turned on. Therefore, the voltage at the node N6 (that is, the transient voltage to be supplied to the auxiliary transistor 131) can be made to be a voltage securely causing the auxiliary transistor 131 to enter the ON state at the time of the overshooting variation of the output voltage VOUT.

Similarly, the auxiliary transistor 334 is electrically connected between the node N11 and the resistive element R5. The auxiliary transistor 334 includes a PMOS transistor PM4. The source of the PMOS transistor PM4 is electrically connected to the power node E10 through the node N11 and the node N1, the drain is electrically connected to one end of the resistive element R5, and the gate is electrically connected to the drain. The dimension (=W/L; here, W: gate width, and L: gate length) of the PMOS transistor PM4 can be made equal to that of the PMOS transistor PM2.

The one end of the resistive element R5 is electrically connected to the drain of the auxiliary transistor 334, and the other end is electrically connected to the node N7. Setting an ON resistance value of the auxiliary transistor 334 to Ron4, a resistance value R5 of the resistive element R5 is determined as R5+Ron4≈R3 (see FIG. 3).

In a case where the undershooting fluctuation occurs in the output voltage VOUT due to the very speedy fluctuation of the output current IOUT and the voltage at the node N7 is temporally decreased from the bias voltage, the current flows from the node N11 to the auxiliary transistor 334, the resistive elements R5, R2, and R4, and the auxiliary transistor 333 in a state where the auxiliary transistor 334 is turned on. Therefore, the voltage at the node N7 (that is, the transient voltage to be supplied to the auxiliary transistor 132) can be made to be a voltage securely causing the auxiliary transistor 132 to enter the ON state at the time of the undershooting fluctuation of the output voltage VOUT.

As described above, in the third embodiment, the transient voltage to be supplied to the auxiliary transistor 131 can be made to be a voltage securely causing the auxiliary transistor 131 to enter the ON state at the time of the overshooting variation of the output voltage VOUT using the auxiliary transistor 333 and the resistive element R4. In addition, the transient voltage to be supplied to the auxiliary transistor 132 can be made to be a voltage securely causing the auxiliary transistor 132 to enter the ON state at the time of the undershooting variation of the output voltage VOUT using the auxiliary transistor 334 and the resistive element R5.

Fourth Embodiment

Figure 5:
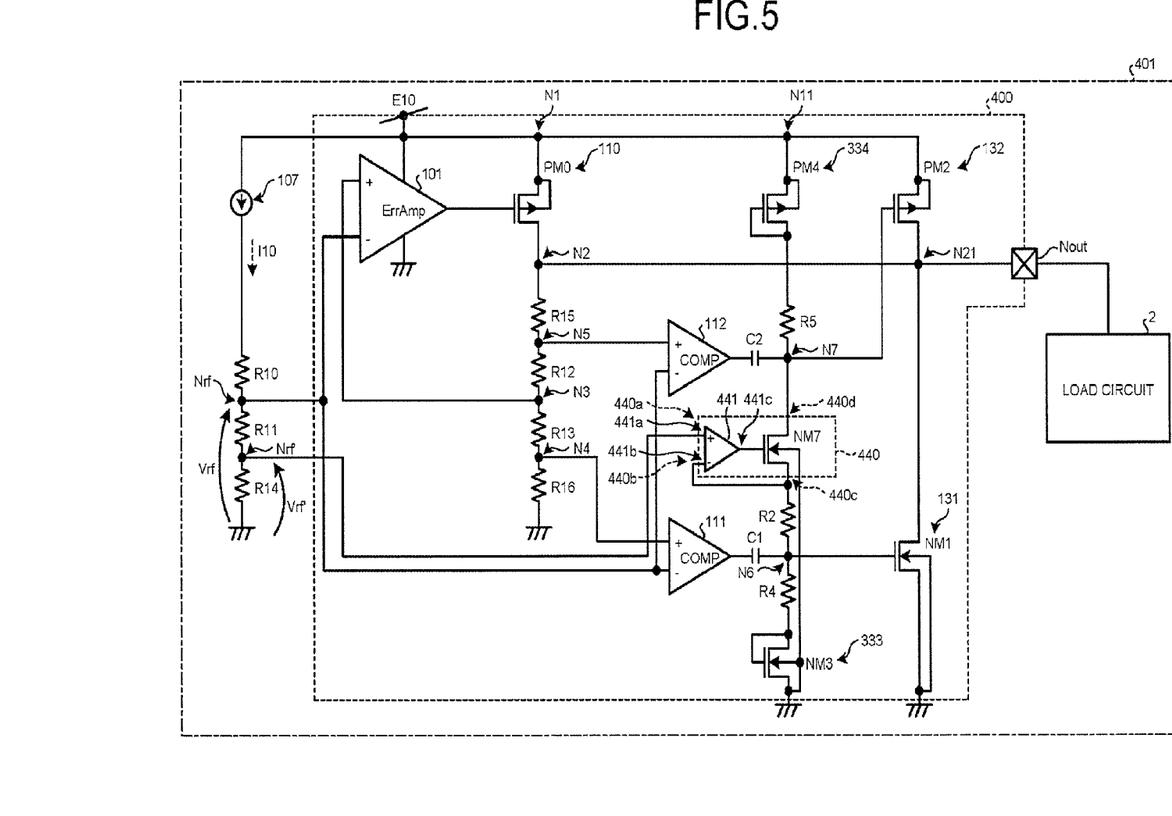
FIG. 5 is a circuit diagram illustrating a configuration of a semiconductor integrated circuit according to a fourth embodiment.

Next, a semiconductor integrated circuit 401 according to a fourth embodiment will be described. In the following, the description will be focused on the portions different from the third embodiment.

In the third embodiment, there has been considered the configuration in which the transient voltage to be supplied to the auxiliary transistors 131 and 132 becomes an appropriate value (turning-on value) at the time of the very speedy variation of the output voltage VOUT even when the resistance values of the respective resistive elements R1, R2, and R3 vary. In the fourth embodiment, a configuration is further considered in which the bias voltage to be supplied to the auxiliary transistors 131 and 132 becomes an appropriate value at a normal time.

Specifically, the semiconductor integrated circuit 401 includes a regulator circuit 400 in place of the regulator circuit 300 (see FIG. 4) as illustrated in FIG. 5. The regulator circuit 400 further includes a voltage follower 440.

The voltage follower 440 includes a non-inverting input terminal 440a, an inverting input terminal 440b, an output terminal 440c, and an output terminal 440d. The non-inverting input terminal 440a of the voltage follower 440 is connected to a reference node Nrf'. The reference node Nrf' is a node between the resistive element R11 and the resistive element R14, and has a reference voltage Vrf' (=Vrf×R14/(R11+R14)). The output terminal 440c is electrically connected to the inverting input terminal 440b. The potential of the output terminal 440d has a value according to a potential of the output terminal 440c. The voltage follower 440 is operated such that the potential of the output terminal 440c approaches the reference voltage Vrf'. Therefore, the potential of the output terminal 440c and the potential of the output terminal 440d each can be stabilized, and the potentials at the nodes N6 and N7 each can be stabilized. Further, the output terminal 440c and the output terminal 440d may be formed as a common output terminal.

The voltage follower 440 includes a differential amplifier 441 and an NMOS transistor NM7. The differential amplifier 441 includes a non-inverting input terminal 441a, an inverting input terminal 441b, and an output terminal 441c. The non-inverting input terminal 441a serves as the non-inverting input terminal 440a of the voltage follower 440. The inverting input terminal 441b serves as the inverting input terminal 440b of the voltage follower 440. The output terminal 441c is connected to the gate of the NMOS transistor NM7. The source of the NMOS transistor NM7 serves as the output terminal 440c of the voltage follower 440. The drain of the NMOS transistor NM7 serves as the output terminal 440d of the voltage follower 440.

As described above, in the fourth embodiment, since the potentials at the nodes N6 and N7 each can be stabilized using the voltage follower 440, the bias voltage to be supplied to the auxiliary transistors 131 and 132 is easily made to be an appropriate value (a value suitable to the operation in the weak inversion region) at a normal time.

Fifth Embodiment

Figure 6:
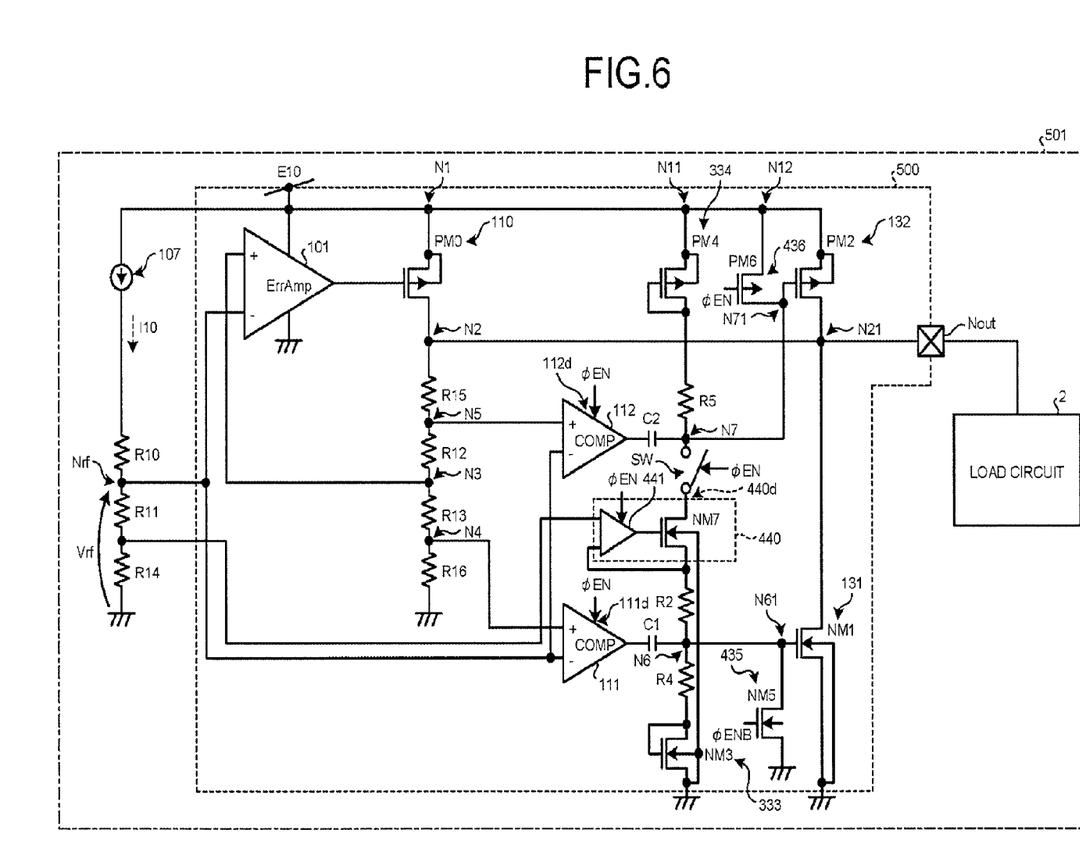
FIG. 6 is a circuit diagram illustrating a configuration of a semiconductor integrated circuit according to a fifth embodiment.

Next, a semiconductor integrated circuit 501 according to a fifth embodiment will be described. In the following, the description will be focused on the portions different from the fourth embodiment.

In the fourth embodiment, the high-speed response second and third feedback loops from which the DC component is cut are in the operable state at a normal time. However, in the fifth embodiment, the second feedback loop and the third feedback loop are able to be switched between at operable state and inoperable state.

Specifically, the semiconductor integrated circuit 501 includes a regulator circuit 500 in place of the regulator circuit 400 (see FIG. 5) as illustrated in FIG. 6. The regulator circuit 500 further includes an auxiliary transistor 435, an auxiliary transistor 436, and a switch SW.

The auxiliary transistor 435 includes an NMOS transistor NM5. The gate of the NMOS transistor NM5 is supplied with an enable bar signal φENB, the source is electrically connected to the reference potential (for example, the ground potential), and the drain is electrically connected to the node N6 through a node N61. The enable bar signal φENB may be generated by logically inverting an enable signal φEN using the semiconductor integrated circuit 501. The enable bar signal φENB is a low active signal which activates the auxiliary transistor 131 at the L level.

In other words, the auxiliary transistor 435 is turned off by the enable bar signal φENB at the active level (the L level), and makes the auxiliary transistor 131 set to a state where a gate voltage is changeable so as to activate the auxiliary transistor 131. The auxiliary transistor 435 is turned on by the enable bar signal φENB at a non-active level (the H level), and fixes the gate voltage of the auxiliary transistor 131 to the L level so as to deactivate the auxiliary transistor 131 (the NMOS transistor NM1).

The auxiliary transistor 436 includes a PMOS transistor PM6. The gate of the PMOS transistor PM6 is supplied with the enable signal φEN, the source is electrically connected to the power node E10 through the nodes N12, N11, and N1, and the drain is electrically connected to the node N7 through a node N71. The enable signal φEN is a high active signal which activates the auxiliary transistor 132 at the H level.

In other words, the auxiliary transistor 436 is turned off by the enable signal φEN at the active level (the H level) to make the auxiliary transistor 132 set to a state where a gate voltage is changeable so as to activate the auxiliary transistor 132. The auxiliary transistor 436 is turned on by the enable signal φEN at the non-active level (the L level), and fixes the gate voltage of the auxiliary transistor 132 to the H level so as to deactivate the auxiliary transistor 132 (the PMOS transistor PM2).

The switch SW is electrically connected in series with respect to the auxiliary transistor 333, the resistive element R5, the resistive element R2, the resistive element R4, and the auxiliary transistor 334. For example, the one end of the switch SW is electrically connected to the output terminal 440d of the voltage follower 440, and the other end is electrically connected to the node N7. The switch SW is turned on by the enable signal φEN at the active level (the H level) so as to activate the auxiliary transistor 333, the resistive element R5, the resistive element R2, the resistive element R4, and the auxiliary transistor 334. The switch SW is turned off by the enable signal φEN at the non-active level (the L level) so as to activate the auxiliary transistor 333, the resistive element R5, the resistive element R2, the resistive element R4, and the auxiliary transistor 334.

The comparator 111 includes a control terminal 111d to which the enable signal φEN is supplied. The comparator 111 enters a state where it is operable by the enable signal φEN at the active level, and enters a state where it is not operable by the enable signal φEN at the non-active level.

The comparator 112 includes a control terminal 112d to which the enable signal φEN is supplied. The comparator 112 enters a state where it is operable by the enable signal φEN at the active level, and enters a state where it is not operable by the enable signal φEN at the non-active level.

As described above, in the fifth embodiment, the second feedback loop and the third feedback loop can be switched to the operable state by setting the enable signal φEN and the enable bar signal φENB to the active level. The second feedback loop and the third feedback loop can be switched to the inoperable state by setting the enable signal φEN and the enable bar signal φENB to be the non-active level. Therefore, in a case where the operation speed of the load circuit 2 is late, in a case where the operation can sufficiently follow the variation of the output voltage VOUT through the first feedback control, and in a case where it is tried to reduce the power consumption in a standby state, it is possible to reduce the power consumption of the regulator circuit 500 by switching the second feedback loop and the third feedback loop to the inoperable state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
    an output transistor that is electrically connected between a first node on a side near a power source and a second node on a side near an output;
    an error amplifier, a first input terminal of which is electrically connected to a third node, a second input terminal of which is electrically connected to a first reference voltage, and an output terminal of which is electrically connected to a gate of the output transistor, the third node being arranged between the second node and a reference potential, the third node having a first voltage which is based on a voltage of the second node;
    a first comparing circuit, a first input terminal of which is electrically connected to a fourth node, and a second input terminal of which is electrically connected to the first reference voltage, the fourth node being arranged between the second node and the reference potential, the fourth node having a second voltage which is different from the first voltage and which is based on the voltage of the second node;
    a first coupling capacitance, one end of which is electrically connected to an output terminal of the first comparing circuit; and
    a first auxiliary transistor, a gate of which is electrically connected to the other end of the first coupling capacitance, and a drain of which is electrically connected to the second node.

2. The semiconductor integrated circuit according to claim 1,
    wherein the second voltage is lower than the first voltage, and
    wherein a source of the first auxiliary transistor is electrically connected to the reference potential.

3. The semiconductor integrated circuit according to claim 2, further comprising:

a bias generation circuit that is electrically connected to a sixth node between the other end of the first coupling capacitance and the gate of the first auxiliary transistor.

4. The semiconductor integrated circuit according to claim 2, further comprising:
a first resistive element, one end of which is electrically connected to a sixth node between the other end of the first coupling capacitance and the gate of the first auxiliary transistor, and another end of which is electrically connected to the reference potential; and
a second resistive element, one end of which is electrically connected to the sixth node, and another end of which is electrically to the first node.

5. The semiconductor integrated circuit according to claim 2, further comprising:
a third auxiliary transistor, a gate of which is electrically connected to a drain, and a source of which is electrically connected to the reference potential; and
a fourth resistive element, one end of which is electrically connected to the drain of the third auxiliary transistor, and another end of which is electrically connected to a sixth node between the other end of the first coupling capacitance and the gate of the first auxiliary transistor.

6. The semiconductor integrated circuit according to claim 5, further comprising:
a voltage follower, a first input terminal of which is electrically connected to a second reference voltage, and an output terminal of which is electrically connected to a second input terminal and the sixth node.

7. The semiconductor integrated circuit according to claim 2, further comprising:
a fifth auxiliary transistor, a gate of which is supplied with a first signal to activate the first auxiliary transistor at an active level, and a drain of which is electrically connected to a sixth node between the other end of the first coupling capacitance and the gate of the first auxiliary transistor.

8. The semiconductor integrated circuit according to claim 1,
wherein the second voltage is higher than the first voltage, and
wherein a source of the first auxiliary transistor is electrically connected to the first node.

9. The semiconductor integrated circuit according to claim 8, further comprising:
a second bias generation circuit that is electrically connected to a seventh node between the other end of the first coupling capacitance and the gate of the first auxiliary transistor.

10. The semiconductor integrated circuit according to claim 8, further comprising:
a third resistive element, one end of which is electrically connected to a seventh node between the other end of the first coupling capacitance and the gate of the first auxiliary transistor, and another end of which is electrically connected to the first node; and
a second resistive element, one end of which is electrically connected to the reference potential, and another end of which is electrically connected to the seventh node.

11. The semiconductor integrated circuit according to claim 8, further comprising:
a fourth auxiliary transistor, a gate of which is electrically connected to a drain, and a source of which is electrically connected to the first node; and
a fifth resistive element, one end of which is electrically connected to the drain of the fourth auxiliary transistor, and another end of which is electrically connected to a seventh node between the other end of the first coupling capacitance and the gate of the first auxiliary transistor.

12. The semiconductor integrated circuit according to claim 11, further comprising:
a voltage follower, a first input terminal of which is electrically connected to a second reference voltage, and an output terminal of which is electrically connected to a second input terminal and the seventh node.

13. The semiconductor integrated circuit according to claim 8, further comprising:
a sixth auxiliary transistor, a gate of which is supplied with a second signal to activate the first auxiliary transistor at an active level, and a drain of which is electrically connected to a seventh node between the other end of the first coupling capacitance and the gate of the first auxiliary transistor.

14. The semiconductor integrated circuit according to claim 1,
wherein the second voltage is lower than the first voltage, and
wherein a source of the first auxiliary transistor is electrically connected to the reference potential,
the semiconductor integrated circuit further comprising:
a second comparing circuit, a first input terminal of which is electrically connected to a fifth node, and a second input terminal of which is electrically connected to the first reference voltage, the fifth node being arranged between the second node and the third node, the fifth node having a third voltage which is higher than the first voltage and which is based on the voltage of the second node;
a second coupling capacitance, one end of which is electrically connected to an output terminal of the second comparing circuit; and
a second auxiliary transistor, a gate of which is electrically connected to the other end of the second coupling capacitance, and a drain of which is electrically connected to the second node, wherein
a source of the second auxiliary transistor is electrically connected to the first node.

15. The semiconductor integrated circuit according to claim 14, further comprising:
a bias generation circuit that is electrically connected to a sixth node between the other end of the first coupling capacitance and the gate of the first auxiliary transistor; and
a second bias generation circuit that is electrically connected to a seventh node between the other end of the second coupling capacitance and the gate of the second auxiliary transistor.

16. The semiconductor integrated circuit according to claim 14, further comprising:
a first resistive element, one end of which is electrically connected to a sixth node between the other end of the first coupling capacitance and the gate of the first auxiliary transistor, and another end of which is electrically connected to the reference potential;
a third resistive element, one end of which is electrically connected to the seventh node between the other end of the first coupling capacitance and the gate of the first auxiliary transistor, and another end of which is electrically to the first node; and
a second resistive element, one end of which is electrically connected to the sixth node, and another end of which is electrically connected to the seventh node.

17. The semiconductor integrated circuit according to claim 16, further comprising:
  a switch that is electrically connected in series to the first resistive element, the second resistive element, and the third resistive element and is turned on by a first signal at an active level.

18. The semiconductor integrated circuit according to claim 14, further comprising:
  a third auxiliary transistor, a gate of which is electrically connected to a drain, and a source of which is electrically connected to the reference potential; and
  a fourth resistive element, one end of which is electrically connected to the drain of the third auxiliary transistor, and another end of which is electrically connected to a sixth node between the other end of the first coupling capacitance and the gate of the first auxiliary transistor;
  a fourth auxiliary transistor, a gate of which is electrically connected to a drain, and a source of which is electrically connected to the first node; and
  a fifth resistive element, one end of which is electrically connected to the drain of the fourth auxiliary transistor, and another end of which is electrically connected to a seventh node between the other end of the first coupling capacitance and the gate of the first auxiliary transistor.

19. The semiconductor integrated circuit according to claim 18, further comprising:
  a voltage follower, a first input terminal of which is electrically connected to a second reference voltage, and an output terminal of which is electrically connected to a second input terminal, the sixth node, and the seventh node.

20. The semiconductor integrated circuit according to claim 14, further comprising:
  a fifth auxiliary transistor, a gate of which is supplied with a first signal to activate the first auxiliary transistor at an active level, and a drain of which is electrically connected to a sixth node between the other end of the first coupling capacitance and the gate of the first auxiliary transistor, and
  a sixth auxiliary transistor, a gate of which is supplied with a second signal to activate the second auxiliary transistor at an active level, and a drain of which is electrically connected to a seventh node between the other end of the second coupling capacitance and the gate of the second auxiliary transistor.

* * * * *